(12) United States Patent
Chan et al.

(10) Patent No.: US 11,348,356 B2
(45) Date of Patent: May 31, 2022

(54) DISPLAY SUBSTRATE, FINGERPRINT RECOGNITION METHOD, AND TOUCH DISPLAY DEVICE

(71) Applicant: BOE TECHNOLOGY GROUP CO., LTD., Beijing (CN)

(72) Inventors: Yucheng Chan, Beijing (CN); Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 91 days.

(21) Appl. No.: 16/521,077

(22) Filed: Jul. 24, 2019

(65) Prior Publication Data

US 2020/0034600 A1   Jan. 30, 2020

(30) Foreign Application Priority Data

Jul. 26, 2018   (CN) .......................... 201810836800.5

(51) Int. Cl.
| | | |
|---|---|---|
| *G06F 3/041* | (2006.01) | |
| *G06V 40/13* | (2022.01) | |
| *H01L 27/32* | (2006.01) | |
| *H01L 51/52* | (2006.01) | |
| *H01L 51/56* | (2006.01) | |

(52) U.S. Cl.
CPC ............ *G06V 40/13* (2022.01); *G06F 3/0412* (2013.01); *H01L 27/323* (2013.01);
(Continued)

(58) Field of Classification Search
CPC .............. G06K 9/0004; G06K 9/00013; G06F 3/0412; G06F 3/042; G06F 3/0421;
(Continued)

(56) References Cited

U.S. PATENT DOCUMENTS

2015/0331508 A1* 11/2015 Nho ...................... G06F 3/0445
  345/173
2016/0358943 A1   12/2016 Okada et al.
(Continued)

FOREIGN PATENT DOCUMENTS

| CN | 103886299 A | 6/2014 |
|---|---|---|
| CN | 105975963 A | 9/2016 |

(Continued)

OTHER PUBLICATIONS

First Office Action dated Mar. 1, 2021 corresponding to Chinese application No. 201810836800.5.

*Primary Examiner* — Yuzhen Shen
(74) *Attorney, Agent, or Firm* — Nath, Goldberg & Meyer; Joshua B. Goldberg

(57) ABSTRACT

The present disclosure provides a display substrate which includes: a base substrate; a light emitting layer located on the base substrate, the light emitting layer including light emitting regions and non-light emitting regions which are arranged alternately, the light emitting regions including multiple light emitting units; and the display substrate further includes a fingerprint recognition region including a touch layer which is disposed on a side of the light emitting layer distal to the base substrate and corresponds to the non-light emitting regions of the light emitting layer, the touch layer including an opaque pattern; the touch layer is provided with at least one pinhole.

19 Claims, 2 Drawing Sheets

(52) U.S. Cl.
CPC ...... *H01L 27/3234* (2013.01); *H01L 51/5206* (2013.01); *H01L 51/56* (2013.01); *H01L 27/3244* (2013.01)

(58) Field of Classification Search
CPC ............. H01L 27/3269; H01L 27/3227; H01L 27/14623; H01L 29/78633
See application file for complete search history.

(56) References Cited

U.S. PATENT DOCUMENTS

| | | | |
|---|---|---|---|
| 2017/0097702 A1* | 4/2017 | Chang ................... | G06K 9/0002 |
| 2018/0083088 A1* | 3/2018 | Bae ..................... | H01L 51/5256 |
| 2019/0004653 A1* | 1/2019 | Won ..................... | G06F 3/0446 |
| 2019/0096971 A1* | 3/2019 | Ukigaya ............. | H01L 51/5012 |
| 2019/0157337 A1* | 5/2019 | Lin ........................ | H01L 31/16 |
| 2019/0294846 A1* | 9/2019 | Li ......................... | G06K 9/0002 |
| 2020/0004381 A1* | 1/2020 | Han ..................... | H01L 27/323 |
| 2020/0026371 A1* | 1/2020 | Baek ................... | H04W 12/06 |
| 2020/0381658 A1* | 12/2020 | Kishimoto ............. | H05B 33/02 |

FOREIGN PATENT DOCUMENTS

| | | | | |
|---|---|---|---|---|
| CN | 106024833 A | * | 10/2016 | ............. H01L 27/32 |
| CN | 107451576 A | | 12/2017 | |
| CN | 107609538 A | | 1/2018 | |
| CN | 107832749 A | | 3/2018 | |
| CN | 108171199 A | | 6/2018 | |
| CN | 108258024 A | | 7/2018 | |

\* cited by examiner

DISPLAY SUBSTRATE, FINGERPRINT RECOGNITION METHOD, AND TOUCH DISPLAY DEVICE

CROSS-REFERENCE TO RELATED APPLICATION

The present application claims the priority to the Chinese Patent Application No. 201810836800.5, filed on Jul. 26, 2018, entitled "Display Substrate, Fingerprint Recognition Method, and Touch Display Device", the disclosure of which is incorporated by reference herein in its entirety.

TECHNICAL FIELD

The present disclosure relates to the field of display technology, and in particular, to a display substrate, a fingerprint recognition method, and a touch display device.

BACKGROUND

Currently, fingerprint recognition is mainly implemented in three methods: capacitive, optical and ultrasonic recognition. A fingerprint collector matched with a display on an electronic equipment is mainly a capacitive sensor, and a panel with touch and fingerprint recognition function is usually disposed over a display screen.

Organic Light-Emitting Diode (OLED) has self-luminous property and is widely used in the field of display technology. With the development of narrow bezel technology, the requirement for OLED display screen is getting higher and higher. How to integrate the fingerprint recognition function into the OLED display screen becomes an urgent problem to be solved.

SUMMARY

The present disclosure provides a display substrate, a fingerprint recognition method, and a touch display device to integrate the fingerprint recognition function into the display substrate.

In a first aspect, the present disclosure provides a display substrate which includes:

a base substrate;

a light emitting layer on the base substrate, the light emitting layer including light emitting regions and non-light emitting regions which are arranged alternately, the light emitting regions including multiple light emitting units; and the display substrate further includes a fingerprint recognition region, the fingerprint recognition region including a touch layer which is disposed on a side of the light emitting layer distal to the base substrate and at a position corresponding to the non-light emitting regions of the light emitting layer, the touch layer comprising an opaque pattern; and the touch layer is provided with at least one pinhole.

In some embodiments, an orthographic projection of the pinhole on the base substrate has a width of about 8 µm to 10 µm, and a distance between adjacent pinholes is about 50 µm to 70 µm.

In some embodiments, the light emitting unit further includes an opaque functional layer extending to an adjacent non-light emitting region, an orthographic projection of the opaque pattern of the touch layer on the base substrate overlaps with an orthographic projection of the functional layer of the adjacent light emitting unit on the base substrate.

In some embodiments, the orthographic projection of the functional layer on the base substrate overlaps with an orthographic projection of the pinhole on the base substrate, so that a light-penetrating aperture with a size smaller than the pinhole is formed between the functional layer and the touch layer when a part of the pinhole is blocked by the function layer.

In some embodiments, an orthographic projection of the light-penetrating aperture on the base substrate has a width of about 8 µm to 10 µm, and a distance between adjacent light-penetrating apertures is about 50 µm to 70 µm.

In some embodiments, the touch layer includes an opaque touch wire in a non-light emitting region, and the touch wire is provided with at least one pinhole.

In some embodiments, the non-light emitting region further includes a non-fingerprint recognition region, an extension width of the touch wire in the fingerprint recognition region is greater than that of the touch wire in the non-fingerprint recognition region.

In some embodiments, the functional layer is a first electrode of the light emitting unit, a metallic layer in which gate lines are located, or a metallic layer in which signal lines are located, and the first electrode is either an anode or a cathode.

In some embodiments, the light emitting layer further includes an encapsulation layer, and the touch layer is disposed on a surface of the encapsulation layer distal to the base substrate.

In some embodiments, the fingerprint recognition region further includes an optical image sensor disposed on a side of the base substrate distal to the touch layer, the optical image sensor includes a light receiving surface, and the orthographic projection of the pinhole on the base substrate is within an orthographic projection region of the light receiving surface of the optical image sensor on the base substrate.

In some embodiments, the fingerprint recognition region further includes an optical image sensor disposed on a side of the base substrate distal to the touch layer, the optical image sensor includes a light receiving surface, and the orthographic projection of the light-penetrating aperture on the base substrate is within an orthographic projection region of the light receiving surface of the optical image sensor on the base substrate.

In some embodiments, the pinholes or the light-penetrating apertures are arranged in an array, and there are one pinhole or one light-penetrating aperture every about 10 to 20 adjacent light emitting units.

In some embodiments, a material of the opaque pattern of the touch layer includes a titanium-aluminum-titanium composite material.

In a second aspect, the present disclosure further provides a method for fabricating a display substrate including:

forming a light emitting layer on a base substrate and forming an encapsulation layer on the light emitting layer, the light emitting layer including light emitting regions and non-light emitting regions which are arranged alternately, the light emitting regions including multiple light emitting units;

forming a touch layer on a side of the encapsulation layer distal to the base substrate, and at least one pinhole is provided in the touch layer, or a light-penetrating aperture is formed between the touch layer and at least one of functional layers of the light emitting units, so that an image of an object on a side of the touch layer distal to the base substrate is formed on a side of the base substrate distal to the touch layer.

In a third aspect, the present disclosure further provides a fin print recognition method applied to the above display substrate including:

acquiring a touch signal by the touch layer;

forming an image, via the pinhole, of a fingerprint on a side of the touch layer distal the base substrate on a side of the base substrate distal to the touch layer; and acquiring, by the optical image sensor, an image formed via the pinhole, and comparing the image with a preset image.

In some embodiments, the fingerprint recognition method includes:

acquiring a touch signal by the touch layer;

forming an image, via the light-penetrating aperture, of a fingerprint on a side of the touch layer distal to the base substrate on a side of the base substrate distal to the touch layer; and acquiring, by the optical image sensor, an image formed via the light-penetrating aperture, and comparing the image with a preset image.

In a fourth aspect, the present disclosure further provides a touch display device including the above display substrate, the light emitting units are configured to provide a light source for both screen display and fingerprint detection.

DETAILED DESCRIPTION

The technical solutions in embodiments of the present disclosure will be clearly and completely described below in conjunction with drawings in the embodiments of the present disclosure. It is apparent that the embodiments described in the present disclosure are only a part of the embodiments of the present disclosure, and not all of them. All other embodiments obtained by a person of ordinary skill in the art based on the embodiments of the present disclosure without creative efforts are within the protective scope of the present disclosure.

Figure 1:
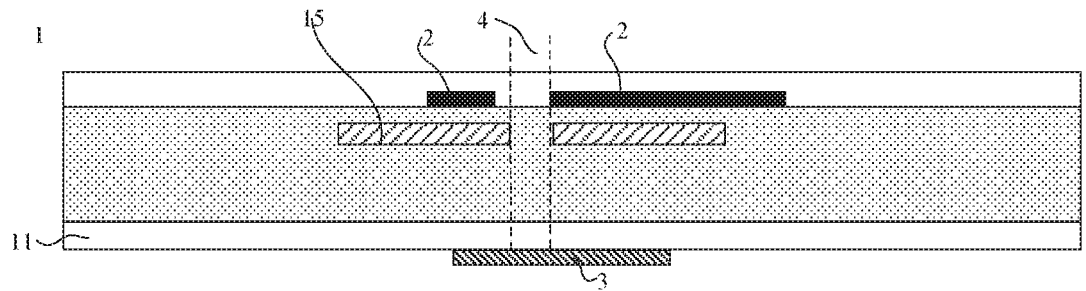
FIG. 1 is a cross-sectional view of a display substrate according to an embodiment of the present disclosure.

As shown in FIG. 1, a display substrate according to an embodiment of the present disclosure includes a base substrate 11, a light emitting layer on the base substrate 11 and an encapsulation layer on the light emitting layer; the light emitting layer includes light emitting regions and non-light emitting regions which are arranged alternately, the light emitting regions include multiple light emitting units, and a side of the light emitting layer distal to the base substrate 11 is a light-outgoing side thereof.

The display substrate further includes a fingerprint recognition region. The fingerprint recognition region includes a touch layer 2 which is disposed on a side of the encapsulation layer distal to the base substrate 11 and at a position corresponding to the non-light emitting regions. The touch layer includes an opaque pattern on a position corresponding to non-light emitting regions of the display substrate. The non-light emitting regions of the display substrate correspond to the non-light emitting regions of the light emitting layer. It will be appreciated that, the opaque pattern of the touch layer 2 is located in the non-light emitting regions of the display substrate to avoid affecting the aperture ratio of the display substrate. The touch layer includes at least one pinhole 4. An orthographic projection of each pinhole on the base substrate has a width of about 8 to 10 μm, and a distance between adjacent pinholes is about 50 to 70 μm. A shape of a cross section of the pinhole is not limited, and may be a circle, a rectangle, or a square. The pinhole 4 alone can form an imaging aperture for forming a fingerprint image. The light emitting layer further includes functional layers 15. A functional layer extends to an adjacent non-light emitting region from a light emitting region in which it is located. The functional layers in adjacent light emitting units are not in contact with each other in the non-light emitting region therebetween. An orthographic projection of the functional layer 15 on the base substrate overlaps the orthographic projection of the pinhole 4 on the base substrate. Thus, in a plane perpendicular to the optical path forming the fingerprint image, an imaging aperture for forming a fingerprint image is formed between the touch layer 2 and the functional layer. After the light emitted by a light emitting unit immediately adjacent to the fingerprint recognition region is reflected by the fingerprint, a fingerprint image is formed on a side of the base substrate distal to the light emitting layer via the imaging aperture. The fingerprint image is formed by the light emitted from the light emitting unit via the pinholes 4, or via a light-penetrating aperture which is formed between the touch layer 2 and at least one of the functional layers 15 of the light emitting units.

It will be appreciated that, the functional layer 15 is an essential structural layer for achieving functions of the display substrate, such as a structural layer for providing electrical signals to the light emitting units or for forming an electrical field. Specifically, it may be, for example, an anode layer of the light emitting units, a metallic layer in which gate lines of the display substrate, a metallic layer in which data lines, etc.

It will be appreciated that, there is an image receiving device for receiving the image formed via the pinhole 4 on a side of the base substrate 11 distal to the pinhole 4. For example, it may be an optical image sensor capable of receiving the image formed via the pinhole for fingerprint recognition. In some embodiments, a distance between the pinhole 4 and the optical image sensor is about 350 μm to 420 μm, and the distance between an object (a finger or a fingerprint) and the pinhole is about 300 μm to 1200 μm. In some embodiments, a ratio of the distance between the object and the pinhole to the distance between the image and the pinhole is 3:1.

The display substrate of the embodiment of the present disclosure includes the base substrate 11, the light emitting layer and the encapsulation layer 16 on the base substrate 11; the light emitting layer includes the light emitting regions and the non-light emitting regions which are arranged alternately, the light emitting regions include multiple light emitting units, and the non-light emitting regions are located between adjacent light emitting units. The display substrate further includes a fingerprint recognition region. The fingerprint recognition region includes a touch layer 2 which is disposed on the side of the encapsulation layer distal to the base substrate 11. The touch layer includes an opaque pattern at a position corresponding to the non-light emitting regions of the display substrate. The non-light emitting regions of the display substrate are portions corresponding to the non-light emitting regions of the light emitting layer. The touch layer 2 includes at least one pinhole 4. An orthographic projection of each pinhole on the base substrate has a width of about 8 to 10 µm, and the distance between adjacent pinholes is about 50 to 70 µm. The shape of the cross section of the pinhole is not limited, and may be a circle, a rectangle, or a square. The pinhole 4 alone can functions as an imaging aperture for forming a fingerprint image. The functional layer 15 of the light emitting layer discontinues at a position corresponding to a non-light emitting region of the display substrate. In the case that an orthographic projection of the functional layer 15 on the base substrate overlaps an orthographic projection of the pinhole on the base substrate, the light passing through the pinhole 4 is blocked partially by the functional layer 14, in other words, the functional layer 15 blocks a part of the pinhole. An imaging aperture for forming a fingerprint image is formed between the pinhole of the touch layer 2 and the functional layer 15. The imaging aperture has a smaller size than that of the pinhole 4. After the light emitted by a light emitting unit immediately adjacent to the fingerprint recognition region is reflected by a fingerprint, a fingerprint image is formed on a side of the base substrate distal to the light emitting layer via the imaging aperture. That is, the light of the light emitting unit may form the fingerprint image either via the micro holes 4 or via the light-penetrating aperture formed between the touch layer 2 and at least one of the functional layers 15 of the light emitting layer. In the display substrate of the embodiment of the present disclosure, by using the pinhole 4 provided on the existing touch layer 2 of the display substrate or by using the imaging aperture formed between the touch layer 2 and at least one of the functional layers of the light emitting layer, the fingerprint recognition is achieved by forming an image of an object (such as a fingerprint) located on the side of the touch layer distal to the base substrate 11 on the side of the base substrate distal to the touch layer. The present disclosure integrates the fingerprint recognition function into the display substrate without adding other layer structures, such as a light shielding layer or the like, for forming the imaging aperture, which simplifies the manufacturing process, reduces the cost, improves the production capacity, and avoids affecting performances of other layers of the display substrate caused by an opening operation in the added layer structure (such as a light shielding layer).

It will be appreciated that, the display substrate further includes an image receiving device 3 on a side of the base substrate 11 distal to the touch layer 2. The image receiving device 3 functions to receive the image formed via an imaging aperture or the pinhole 4. The orthographic projection of the above pinhole 4 on the base substrate 11 is within an orthographic projection region of the light receiving surface of the optical image sensor 3 on the base substrate, so that the fingerprint image formed via the pinhole 4 can be formed on the corresponding optional image sensor 3.

Figure 2:
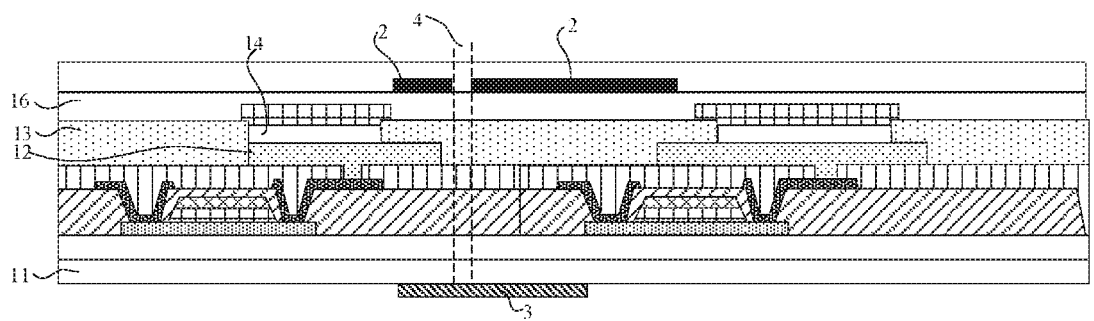
FIG. 2 is a cross-sectional view of another display substrate according to an embodiment of the present disclosure.

The above display substrate may be an OLED display substrate. The display substrate further includes gate lines and data lines on the base substrate 11; the display substrate includes a first electrode 12 and an organic light emitting layer 14, and the first electrode 12 is closer to the base substrate 11 than the organic light emitting layer 14, and may be the anode electrode. The functional layer in the above embodiment includes at least one of a metallic layer in which the gate lines are located, a metallic layer in which the data lines are located, and the first electrode 12. The above touch layer 2 includes an opaque touch wire which is located in the non-light emitting region of the display substrate to prevent the touch wire from affecting the area of the light emitting region and used to form an imaging aperture. The non-light emitting region of the display substrate further includes a non-fingerprint recognition region. An extension width of the touch wire in the fingerprint recognition region is greater than that of the touch wire in the non-fingerprint recognition region. In a specific embodiment, referring to FIG. 2, the pinhole 4 is formed in the touch layer 2.

Further, an orthographic projection of the organic light emitting layer 14 on the base substrate 11 is located within an orthographic projection of the first electrode 12 in the base substrate 11, and the first electrode 12 may be an anode. Thus, in the process of manufacturing the anode of the display substrate, an anode region corresponding to the fingerprint recognition region may be made relatively larger so that, when a normal opening operation is performed on a pixel defining layer 13 on the anode, an anode has an anode margin which is a part of the anode 12 without overlapping with the opening in the pixel defining layer 13; and then the organic light-emitting layer 14 is evaporated into the opening. The anode protrudes beyond the organic light-emitting layer 14 such that, when the touch layer 2 is formed thereafter, the orthographic projection of the touch layer 2 on the substrate 11 overlaps with the orthographic projection of the anode on the substrate 11 so as to avoid light leakage from the boundary of a pixel unit.

Moreover, since the imaging aperture is formed in the fingerprint recognition region, the width of the touch wire in the fingerprint recognition region in the non-light emitting region is greater than the width of the touch wire in the non-fingerprint identification region in the non-light emitting region. A touch wire with a larger width has smaller impedance. Thus, the touch performance of the touch layer 2 may be improved.

In the display substrate of the embodiment of the present disclosure, by providing the pinhole 4 in the touch layer 4, it is not necessary to add other layers such as a light shielding layer or the like in the display substrate to form an imaging aperture, which simplifies the manufacturing process, reduces the cost, improves the production capacity, and avoids affecting the performances of other layers of the display substrate caused by an opening operation on the added layer structure (such as a light shielding layer).

Figure 3:
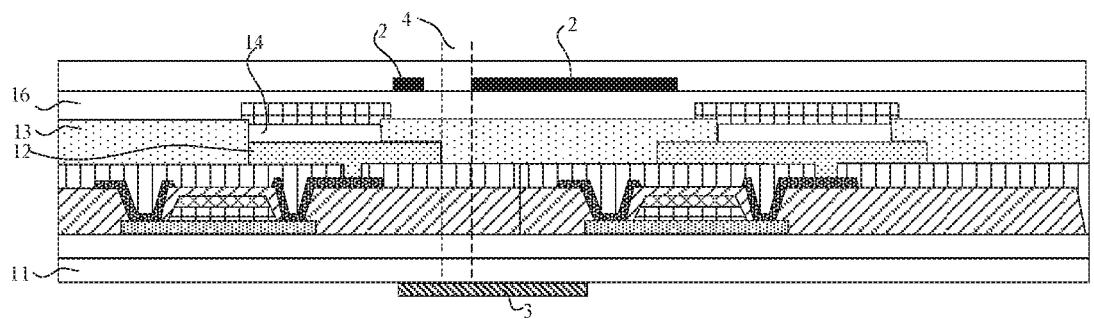
FIG. 3 is a cross-sectional view of still another display substrate according to an embodiment of the present disclosure.

In some embodiments, an imaging aperture may be formed between the touch layer 2 and the first electrode. Referring to FIG. 3, the display substrate is an OLED display substrate. A light emitting unit in the body 1 of the display substrate includes a first electrode 12, an organic light emitting layer 14 and a second electrode 21, and the first electrode 12 is closer to the base substrate 11 than the organic light emitting layer 14, and the second electrode 21 is disposed on a side of the organic light emitting layer 14 distal to the base substrate 11. An imaging aperture is formed between the touch layer 2 and the first electrode 12, and the first electrode 12 may be the anode electrode.

Further, an orthographic projection of the organic light emitting layer 14 on the base substrate is within an orthographic projection region of the anode on the base substrate.

Thus, in the process of manufacturing the anode of the display substrate, an anode region corresponding to the fingerprint recognition region may be made relatively larger so that, when a normal opening operation is performed on the pixel defining layer 13 on the anode, the anode has an anode margin which is a part of the anode without overlapping with the opening in the pixel defining layer 13, and then the organic light-emitting layer 14 is evaporated into the opening. The anode protrudes beyond the organic light-emitting layer 14 such that, when an imaging aperture is formed between a touch wire in the touch layer and the anode in the subsequent process of manufacturing the touch layer 2, the orthographic projection of the touch wire of the touch layer on the substrate 11 partially covers the orthographic projection of the anode on the substrate 11, and thus the touch wire does not affect the organic light emitting layer 14, and does not affect the aperture ratio of the pixel unit.

Moreover, in order to form an imaging aperture in the fingerprint recognition region of the display substrate between the touch wire and the anode, in the fingerprint recognition region, the orthographic projection of the touch wire on the base substrate partially covers the orthographic projection of the anode on the base substrate. Generally, a width of the touch wire in the fingerprint recognition region is greater than a width of the touch wire in the non-fingerprint identification region. A touch wire with a larger width has smaller impedance. Thus, the touch performance of the touch layer 2 may be improved.

In the display substrate of the embodiment of the present disclosure, by forming the imaging aperture between the existing touch wire in the touch layer 2 and the first electrode 12 in the display substrate, it is not necessary to add other layers such as a light shielding layer or the like in the display substrate to form an imaging aperture, which simplifies the manufacturing process, reduces the cost, improves the production capacity, and avoids affecting the performances of other layers of the display substrate caused by an opening operation on the added layer structure (such as a shielding layer).

In some embodiments, a touch wire in the touch layer, and a gate line and a data line in the display substrate may be used to form the imaging aperture.

Similarly, the width of the touch wire in the fingerprint recognition region is generally greater than the width of the touch wire in the non-fingerprint identification region so that an imaging aperture may be formed preferably between the touch wire and the gate line or the data line. A touch wire with a larger width has smaller impedance. Thus, the touch performance of the touch layer 2 may be improved.

In the display substrate according to the embodiment of the present disclosure, by forming the imaging aperture using the existing touch wire in the touch layer and the gate line or data line in the display substrate, it is not necessary to add other layers such as a light shielding layer or the like in the display substrate to form an imaging aperture, which simplifies the manufacturing process, reduces the cost, improves the production capacity, and avoids affecting the performances of other layers of the display substrate caused by an opening operation on the added layer structure (such as a shielding layer).

It will be appreciated that, the touch layer may also be used to form the imaging aperture together with the anode layer and/or the gate line and/or the data line. An imaging aperture formed between the touch layer and other opaque functional layer in the display substrate may also fall within the protective scope of the present disclosure.

In the display substrate according to the above embodiment, a plurality of the imaging apertures may be arranged in an array, and there is one imaging aperture every 10 to 20 adjacent pixel units so as to ensure that the display substrate has a good fingerprint recognition characteristic.

The touch layer 2 includes a first electrode layer and a second electrode layer. The first electrode layer includes a plurality of first touch wires, the second electrode layer includes a plurality of second touch wires, and an insulation layer is provided between the first electrode layer and the second electrode layer. The material of the first or second electrode layer includes a titanium-aluminum-titanium composite material.

It will be appreciated that the imaging aperture may be formed between the first touch wire and the second touch wire, or between the second touch electrode and the above anode layer and/or data line and/or gate line together.

The touch screen in the display substrate according to any of the above embodiments may be a full-screen fingerprint recognition screen in which the entire display region also functions as the fingerprint recognition region.

Figure 4:
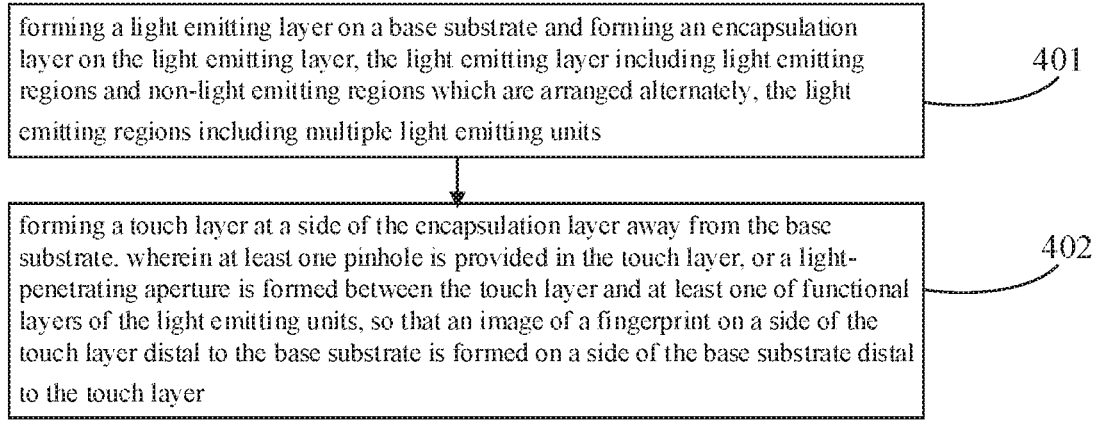
FIG. 4 is a flow chart illustrating a method for fabricating a display substrate according to an embodiment of the present disclosure.

The present disclosure also provides an embodiment of a method for fabricating a display substrate. Referring to FIG. 4, the method includes the following Steps 401-402.

Step 401 includes forming a light emitting layer on a base substrate and forming an encapsulation layer on the light emitting layer, the light emitting layer including light emitting regions and non-light emitting regions which are arranged alternately, the light emitting regions including multiple light emitting units.

It will be appreciated that, in this step, the light emitting layer of the display substrate may be fabricated using the existing process which will not be repeated here. A side of the light emitting layer distal to the base substrate is the light outgoing side of the display substrate.

Step 402 includes forming a touch layer on a side of the encapsulation layer distal to the base substrate, and providing at least one pinhole in the touch layer, or forming a light-penetrating aperture between the touch layer and at least one of functional layers of the light emitting units, so that a fingerprint on a side of the touch layer distal to the base substrate is imaged to a side of the base substrate distal to the touch layer.

In this step, the touch layer is formed on the side of the light emitting unit distal to the base substrate. The touch layer is used to sense a touch signal. The touch wire in the touch layer is located in the non-light emitting regions of the display substrate, which can prevent the touch wire from affecting the aperture ratio of the display substrate.

According to the method for fabricating a display substrate in the embodiment of the present disclosure, the touch layer is formed on the side of the encapsulation layer distal to the base substrate, an imaging aperture is provided in the touch layer, or is formed between the touch layer and at least one of the functional layers of the light emitting regions, and the imaging aperture is used to image a fingerprint on the side of the touch layer distal to the base substrate to the side of the base substrate distal to the touch layer. In the method for fabricating a display substrate in the embodiment of the present disclosure, since the imaging aperture is provided in the touch layer, or is formed between the touch layer and at least one of the functional layers, it is not necessary to add other layers such as a light shielding layer or the like in the display substrate to form an imaging aperture, which simplifies the manufacturing process, reduces the cost, improves the production capacity, and avoids affecting the performances of other layers of the display substrate caused by an opening operation on the added layer structure (such as a shielding layer).

Figure 5:
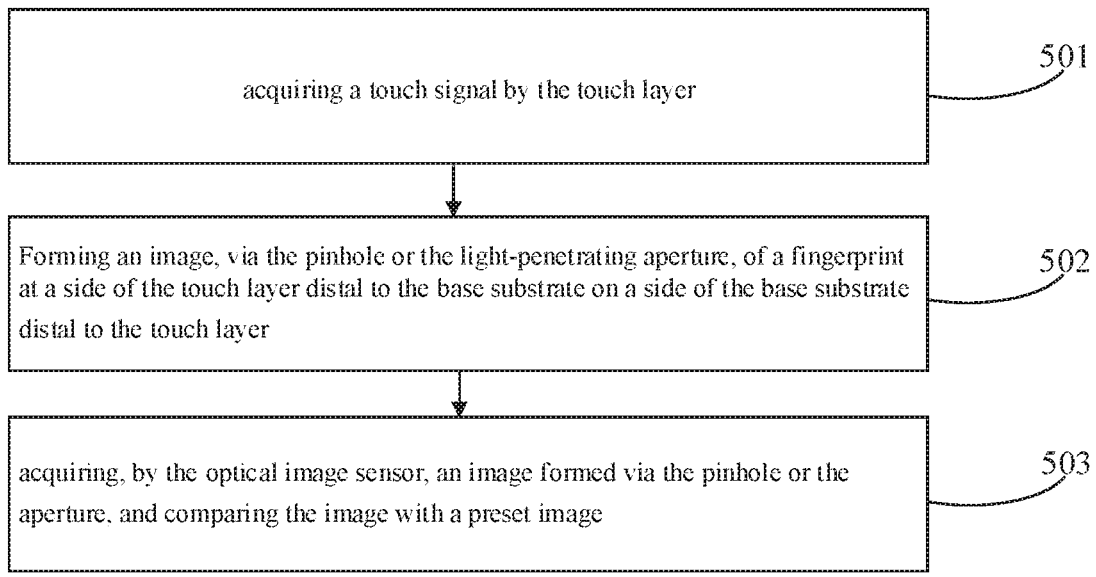
FIG. 5 is a flow chart illustrating a fingerprint recognition method according to an embodiment of the present disclosure.

The present disclosure further provides an embodiment of a fingerprint recognition method which is applied to the display substrate in any of the above embodiments. Referring to FIG. 5, the fingerprint recognition method includes the following Steps 501-503:

Step 501 includes acquiring a touch signal by the touch layer.

The touch layer may sense the touch signal. When a user performs an operation on the display substrate, a touch signal may be sensed on the touch layer.

Step 502 includes forming an image, via the pinhole or the light-penetrating aperture, of a fingerprint on the side of the touch layer distal to the base substrate on the side of the base substrate distal to the touch layer.

It will be appreciated that, an image receiving device for receiving the image formed via the pinhole or the light-penetrating aperture may be provided on the side of the base substrate distal to the touch layer. The image receiving device may be an optical image sensor. The optical image sensor may be provided on the side of the base substrate distal to the image aperture.

Step 503 includes acquiring, by the optical image sensor, the image formed via the pinhole or the light-penetrating aperture, and comparing the image with a preset image.

Specifically, the fingerprint recognition method in the embodiment may employ the following manner: when a user's finger touches the display substrate, the touch layer senses the touch signal, and determines the touch position; then, a processor at a corresponding position of the touch display device controls a corresponding circuit to light the pixel unit(s) near the touch position so as to provide the illumination for projecting the fingerprint on the touch layer on the optical image sensor via the imaging aperture. It will be appreciated that the illumination time should not be too long to avoid affecting subsequent display operations and wasting power. The illumination time may be controlled by the processor. When the optical image sensor can receive an image, the illumination may be terminated.

After the image on the touch layer is transmitted into the optical image sensor, it is compared with the preset image. It will be appreciated that the preset image may be a fingerprint image prestored in the display substrate by the user. If the image matches with the preset image, an unlocking operation is completed, and the touch display device can be operated. If not, the user is prompted to try again.

An embodiment of the present disclosure further provides a touch display device including the display substrate of any of the above embodiments. The touch display device may be any product or component having a touch display function, such as a mobile phone, a tablet, a television, a display, a notebook computer, a digital photo frame, a navigator, an electronic paper, and the like which have a touch function.

The various embodiments in the present specification are described in a progressive manner, and each embodiment focuses on the differences from other embodiments, and the same or similar parts between the various embodiments can be referred to each other. For the system embodiment, since it is substantially similar to the method embodiment, the description related thereto is relatively simple, and the relevant parts can be referred to the description of the method embodiment.

Although alternative embodiments of the present disclosure have been described, those skilled in the art can make additional variations and modifications to the embodiments once they become aware of the basic inventive concept. Therefore, the appended claims are intended to be construed as covering the embodiments and all the variations and modifications in the scope of the embodiments of the present disclosure.

The above is only the specific implementations of the present disclosure, but the scope of the present disclosure is not limited thereto. All the changes or the substitutions within the technical scope of the disclosure that are easily thought of by any person skilled in the art should be covered within the protective scope of the present disclosure. Therefore, the protective scope of the present disclosure should be determined by the protective scope of the claims.

What is claimed is:

1. A display substrate comprising:
   a base substrate;
   a light emitting layer on the base substrate, the light emitting layer comprising light emitting regions and non-light emitting regions which are arranged alternately, the light emitting regions comprising multiple light emitting units; and
   the display substrate further comprising a fingerprint recognition region, the fingerprint recognition region comprising a touch layer which is disposed on a side of the light emitting layer distal to the base substrate, the touch layer comprising an opaque pattern;
   wherein the touch layer is provided with at least one pinhole,
   wherein a light emitting unit of the multiple light emitting units further comprises an opaque functional layer extending to an adjacent non-light emitting region, an orthographic projection of the opaque pattern of the touch layer on the base substrate overlaps with an orthographic projection of a functional layer of the light emitting unit on the base substrate;
   wherein an orthographic projection of the functional layer on the base substrate at least partially overlaps with an orthographic projection of a corresponding pinhole of the at least one pinhole on the base substrate, and a part of the orthographic projection of the functional layer which is overlapped with the orthographic projection of the pinhole on the base substrate is a monolithic structure without any hollow-out in such a manner that an orthographic projection of an extending part of the functional layer on the base substrate is configured to block a part of the orthographic projection of the pinhole on the base substrate from one side of the pinhole and an imaging aperture for forming a fingerprint image with a size smaller than that of the pinhole in a direction parallel to the base substrate is formed by both the extending part of the functional layer and the pinhole provided in the touch layer.

2. The display substrate of claim 1, wherein an orthographic projection of the pinhole on the base substrate has a width of about 8 μm to 10 μm, and a distance between adjacent pinholes is about 50 μm to 70 μm.

3. The display substrate of claim 2, wherein the fingerprint recognition region further comprises an optical image sensor disposed on a side of the base substrate distal to the touch layer, the optical image sensor comprises a light receiving surface, and the orthographic projection of the pinhole on the base substrate is within an orthographic projection region of the light receiving surface of the optical image sensor on the base substrate.

4. The display substrate of claim 3, wherein the pinholes are arranged in an array, and there are one pinhole every about 10 to 20 adjacent light emitting units.

5. A fingerprint recognition method applied to the display substrate of claim 3, comprising:
   acquiring a touch signal by the touch layer;
   forming an image, via the pinhole, of a fingerprint on a side of the touch layer distal to the base substrate on a side of the base substrate distal to the touch layer; and acquiring, by the optical image sensor, an image formed via the pinhole, and comparing the image with a preset image.

6. The display substrate of claim 1, wherein an orthographic projection of the imaging aperture on the base substrate has a width of about 8 µm to 10 µm, and a distance between adjacent imaging apertures is about 50 µm to 70 µm.

7. The display substrate of claim 6, wherein the fingerprint recognition region further comprises an optical image sensor disposed on a side of the base substrate distal to the touch layer, the optical image sensor comprises a light receiving surface, and the orthographic projection of the imaging aperture on the base substrate is within an orthographic projection region of the light receiving surface of the optical image sensor on the base substrate.

8. The display substrate of claim 7, wherein the imaging apertures are arranged in an array, and there are one imaging aperture every about 10 to 20 adjacent light emitting units.

9. A fingerprint recognition method applied to the display substrate of claim 7, comprising:
acquiring a touch signal by the touch layer;
forming an image, via the imaging aperture, of a fingerprint on a side of the touch layer distal to the base substrate on a side of the base substrate distal to the touch layer; and
acquiring, by the optical image sensor, an image formed via the imaging aperture and comparing the image with a preset image.

10. The display substrate of claim 1, wherein the touch layer comprises an opaque touch wire in a non-light emitting region, and the touch wire is provided with at least one pinhole.

11. The display substrate of claim 1, wherein the functional layer is a first electrode of the light emitting unit, a metallic layer in which gate lines are located, or a metallic layer in which signal lines are located, and the first electrode is either an anode or a cathode.

12. The display substrate of claim 1, the light emitting layer further comprises an encapsulation layer, and the touch layer is disposed on a surface of the encapsulation layer distal to the base substrate.

13. The display substrate of claim 12, wherein the functional layer is a first electrode, and the light emitting unit further comprises an organic emitting layer on the first electrode and a second electrode on the organic emitting layer,
the organic emitting layer is defined in an opening of a pixel defining layer,
the second electrode is arranged on the pixel defining layer and below the encapsulation layer, and
the second electrode is not overlapped with the pinhole.

14. The display substrate of claim 1, wherein a material of the opaque pattern of the touch layer comprises a titanium-aluminum-titanium composite material.

15. A touch display device comprising the display substrate of claim 1, wherein the light emitting units are configured to provide a light source for both screen display and fingerprint detection.

16. The display substrate of claim 1, wherein the touch layer is only provided at a position corresponding to the non-light emitting regions of the light emitting layer.

17. A method for fabricating a display substrate comprising:
forming a light emitting layer on a base substrate and forming an encapsulation layer on the light emitting layer, the light emitting layer comprising light emitting regions and non-light emitting regions which are arranged alternately, the light emitting regions comprising multiple light emitting units;
forming a touch layer on a side of the encapsulation layer distal to the base substrate, the touch layer comprising an opaque pattern, wherein at least one pinhole is provided in the touch layer, a light emitting unit of the multiple light emitting units further comprises an opaque functional layer extending to an adjacent non-light emitting region, an orthographic projection of the opaque pattern of the touch layer on the base substrate overlaps with an orthographic projection of a functional layer of the light emitting unit on the base substrate;
wherein an orthographic projection of the functional layer on the base substrate at least partially overlaps with an orthographic projection of a corresponding pinhole of the at least one pinhole on the base substrate, and a part of the orthographic projection of the functional layer which is overlapped with the orthographic projection of the pinhole on the base substrate is a monolithic structure without any hollow-out in such a manner that an orthographic projection of an extending part of the functional layer on the base substrate is configured to block a part of the orthographic projection of the pinhole on the base substrate from one side of the pinhole and an imaging aperture for forming a fingerprint image with a size smaller than that of the pinhole in a direction parallel to the base substrate is formed by both the extending part of the functional layer and the pinhole provided in the touch layer.

18. The method of claim 17, wherein the touch layer is only provided at a position corresponding to the non-light emitting regions of the light emitting layer.

19. The method of claim 17, wherein the functional layer is a first electrode, and the light emitting unit further comprises an organic emitting layer on the first electrode and a second electrode on the organic emitting layer,
the organic emitting layer is defined in an opening of a pixel defining layer,
the second electrode is arranged on the pixel defining layer and below the encapsulation layer, and
the second electrode is not overlapped with the pinhole.

* * * * *